US011948888B2

(12) United States Patent
Shin et al.

(10) Patent No.: US 11,948,888 B2
(45) Date of Patent: Apr. 2, 2024

(54) SEMICONDUCTOR DEVICE

(71) Applicant: SAMSUNG ELECTRONICS CO., LTD., Suwon-si (KR)

(72) Inventors: Hongsik Shin, Seoul (KR); Sanghyun Lee, Hwaseong-si (KR); Hakyoon Ahn, Seoul (KR); Seonghan Oh, Namyangju-si (KR); Youngmook Oh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 27 days.

(21) Appl. No.: 17/338,787

(22) Filed: Jun. 4, 2021

(65) Prior Publication Data

US 2021/0296254 A1    Sep. 23, 2021

Related U.S. Application Data

(63) Continuation of application No. 16/167,717, filed on Oct. 23, 2018, now Pat. No. 11,031,340.

(30) Foreign Application Priority Data

Jan. 25, 2018  (KR) .................. 10-2018-0009299

(51) Int. Cl.
*H01L 23/532* (2006.01)
*H01L 21/308* (2006.01)
(Continued)

(52) U.S. Cl.
CPC .... *H01L 23/53295* (2013.01); *H01L 21/3083* (2013.01); *H01L 21/76829* (2013.01);
(Continued)

(58) Field of Classification Search
None
See application file for complete search history.

(56) References Cited

U.S. PATENT DOCUMENTS 5,899,742 A * 5/1999 Sun .................. H01L 21/76895
257/E21.507
7,078,292 B2 * 7/2006 Park .................. H01L 27/10855
438/254
(Continued)

FOREIGN PATENT DOCUMENTS

CN    101587860 A    11/2009
CN    106169439 A    11/2016
(Continued)

*Primary Examiner* — Hung K Vu
(74) *Attorney, Agent, or Firm* — Fish & Richardson P.C.

(57) ABSTRACT

A semiconductor device including a metal pattern on a semiconductor substrate; an etch stop layer covering the metal pattern, the etch stop layer including a sequentially stacked first insulation layer, second insulation layer, and third insulation layer; an interlayer dielectric layer on the etch stop layer; and a contact plug penetrating the interlayer dielectric layer and the etch stop layer, the contact plug being connected to the metal pattern, wherein the first insulation layer includes a first insulating material that contains a metallic element and nitrogen, wherein the second insulation layer includes a second insulating material that contains carbon, and wherein the third insulation layer includes a third insulating material that does not contain a metallic element and carbon.

10 Claims, 17 Drawing Sheets

(51) Int. Cl.
*H01L 21/768* (2006.01)
*H01L 21/8234* (2006.01)
*H01L 27/06* (2006.01)
*H01L 27/088* (2006.01)
*H01L 29/66* (2006.01)
*H01L 49/02* (2006.01)
*H01L 29/165* (2006.01)

(52) U.S. Cl.
CPC .. *H01L 21/76837* (2013.01); *H01L 21/76846* (2013.01); *H01L 21/76897* (2013.01); *H01L 21/823475* (2013.01); *H01L 27/0629* (2013.01); *H01L 27/088* (2013.01); *H01L 28/20* (2013.01); *H01L 29/66545* (2013.01); *H01L 29/165* (2013.01); *H01L 29/665* (2013.01); *H01L 29/66636* (2013.01)

(56) References Cited

U.S. PATENT DOCUMENTS

| | | |
|---|---|---|
| 7,637,269 B1 | 12/2009 | Zin et al. |
| 7,902,629 B2 | 3/2011 | Chinthakindi et al. |
| 7,998,825 B2 | 8/2011 | Song et al. |
| 8,680,618 B2 * | 3/2014 | Eshun .............. H01L 29/8605 |
| | | 257/350 |
| 9,240,403 B2 | 1/2016 | Hung et al. |
| 9,406,770 B2 | 8/2016 | Song et al. |
| 9,437,484 B2 | 9/2016 | Jangjian et al. |
| 9,754,818 B2 | 9/2017 | Shiu et al. |
| 9,761,488 B2 | 9/2017 | Cheng et al. |
| 10,229,876 B2 | 3/2019 | Kim et al. |
| 2002/0060351 A1* | 5/2002 | Shin .................... H01L 27/0688 |
| | | 257/536 |
| 2005/0111247 A1 | 5/2005 | Takaura et al. |
| 2006/0183280 A1 | 8/2006 | Lee et al. |
| 2007/0096183 A1 | 5/2007 | Ogawa et al. |
| 2008/0048166 A1* | 2/2008 | Takaura .............. H01L 27/2472 |
| | | 257/E47.001 |
| 2016/0372413 A1 | 12/2016 | Mahalingam et al. |
| 2017/0178949 A1 | 6/2017 | Nguyen et al. |
| 2017/0194242 A1* | 7/2017 | Huang .............. H01L 21/76813 |
| 2018/0130796 A1* | 5/2018 | Jun .................... H01L 27/0924 |
| 2018/0350669 A1 | 12/2018 | Huang et al. |
| 2019/0043803 A1 | 2/2019 | You et al. |
| 2019/0164748 A1 | 5/2019 | Chou et al. |

FOREIGN PATENT DOCUMENTS

| | | |
|---|---|---|
| CN | 107039375 A | 8/2017 |
| KR | 10-1688231 B1 | 12/2016 |
| KR | 10-1776387 B1 | 9/2017 |

* cited by examiner

SEMICONDUCTOR DEVICE

CROSS-REFERENCE TO RELATED APPLICATIONS

This is a continuation application based on pending application Ser. No. 16/167,717, filed Oct. 23, 2018, the entire contents of which is hereby incorporated by reference.

Korean Patent Application No. 10-2018-0009299 filed on Jan. 25, 2018, in the Korean Intellectual Property Office, and entitled: "Semiconductor Device," is incorporated by reference herein in its entirety.

BACKGROUND

1. Field

Embodiments relate to a semiconductor device.

2. Description of the Related Art

A semiconductor device may include an integrated circuit that includes metal oxide semiconductor field effect transistors (MOSFET's).

SUMMARY

The embodiments may be realized by providing a semiconductor device including a metal pattern on a semiconductor substrate; an etch stop layer covering the metal pattern, the etch stop layer including a sequentially stacked first insulation layer, second insulation layer, and third insulation layer; an interlayer dielectric layer on the etch stop layer; and a contact plug penetrating the interlayer dielectric layer and the etch stop layer, the contact plug being connected to the metal pattern, wherein the first insulation layer includes a first insulating material that contains a metallic element and nitrogen, wherein the second insulation layer includes a second insulating material that contains carbon, and wherein the third insulation layer includes a third insulating material that does not contain a metallic element and carbon.

The embodiments may be realized by providing a semiconductor device including a plurality of gate structures on a semiconductor substrate; a plurality of source/drain impurity layers in the semiconductor substrate on opposite sides of each gate structure of the plurality of gate structures; a plurality of metal contact patterns connected to the plurality of gate structures and the plurality of source/drain impurity layers; an etch stop layer covering top surfaces of the plurality of metal contact patterns and top surfaces of the plurality of gate structures; an interlayer dielectric layer on the etch stop layer; and a contact plug penetrating the interlayer dielectric layer and the etch stop layer and connected to one metal contact pattern of the plurality of metal contact patterns, wherein the etch stop layer includes a sequentially stacked first insulation layer, second insulation layer, and third insulation layer, and wherein the first insulation layer, second insulation layer, and third insulation layer include different insulating materials from each other.

The embodiments may be realized by providing a semiconductor device including a semiconductor substrate including a first region and a second region; a plurality of field effect transistors on the first region and the second region of the semiconductor substrate; a plurality of metal contact patterns in a gap-fill insulation layer covering the field effect transistors, the plurality of metal contact patterns being connected to the field effect transistors; an etch stop layer covering top surfaces of the plurality of metal contact patterns and including a sequentially stacked first insulation layer, second insulation layer, and third insulation layer; a resistance structure on the etch stop layer on the second region; an interlayer dielectric layer covering the resistance structure and the etch stop layer; a first contact plug penetrating the interlayer dielectric layer and the etch stop layer and connected to at least one metal contact pattern of the plurality of metal contact patterns on the first region; and a second contact plug penetrating the interlayer dielectric layer and connected to the resistance structure on the second region, wherein the first insulation layer, second insulation layer, and third insulation layer include different insulating materials from each other.

BRIEF DESCRIPTION OF THE DRAWINGS

Features will be apparent to those of skill in the art by describing in detail exemplary embodiments with reference to the attached drawings in which.

DETAILED DESCRIPTION

Semiconductor devices according to exemplary embodiments will be described hereinafter in detail with reference to the accompanying drawings.

Figure 1:
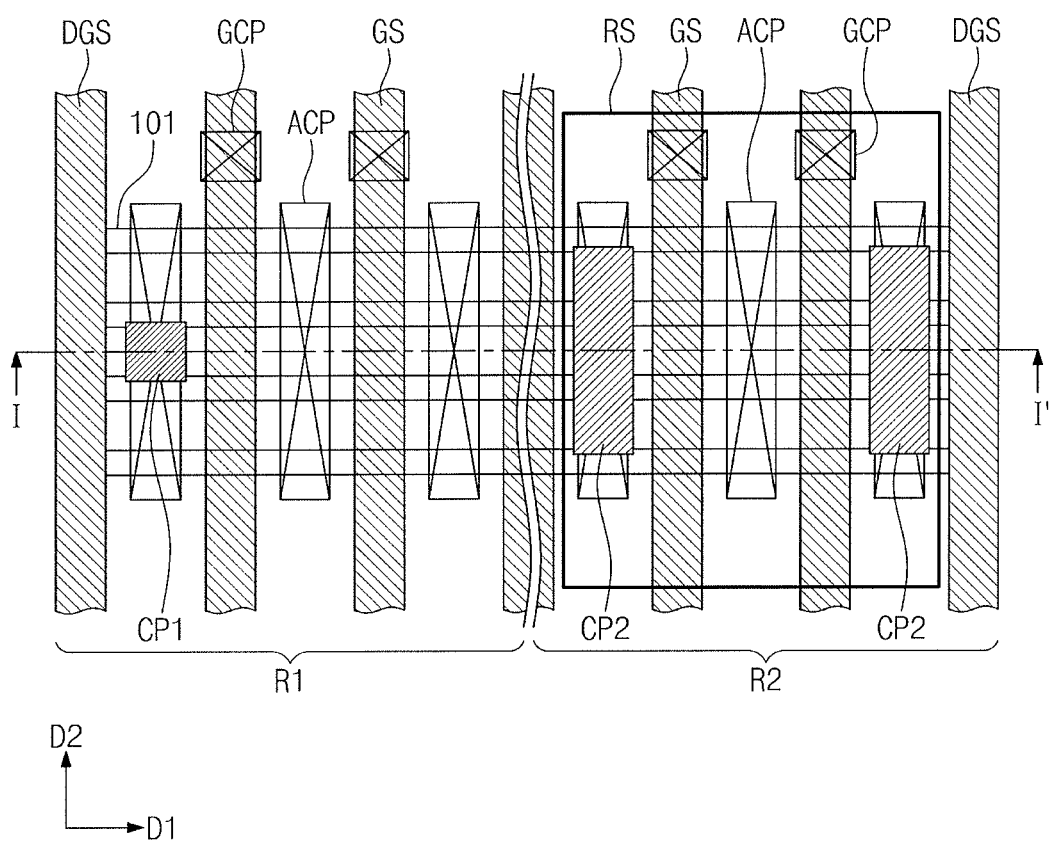
FIG. 1 illustrates a simplified plan view of a semiconductor device according to exemplary embodiments.
Figure 2:
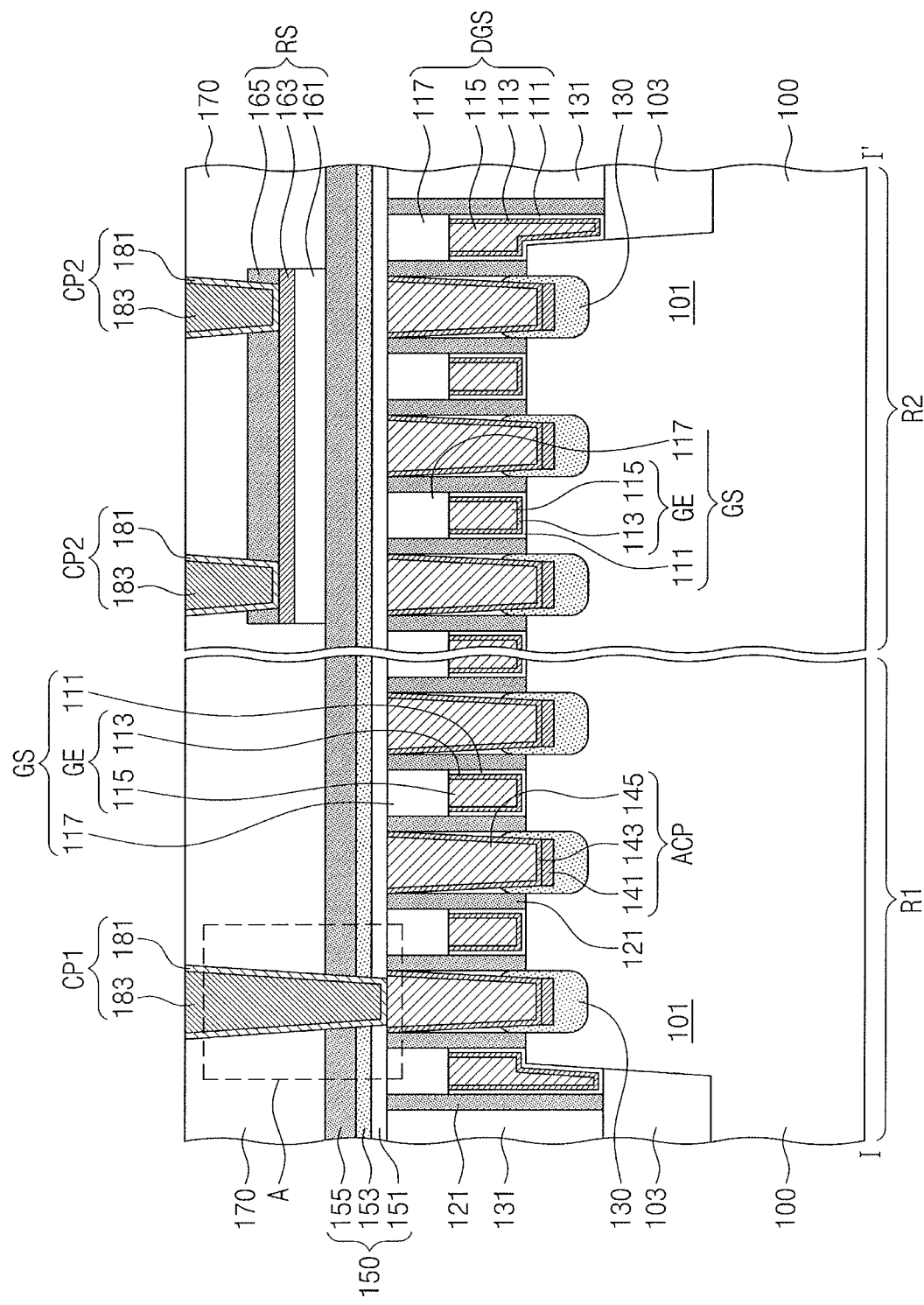
FIG. 2 illustrates a cross-sectional view taken along line I-I' of FIG. 1, showing a semiconductor device according to exemplary embodiments.
Figure 3A:
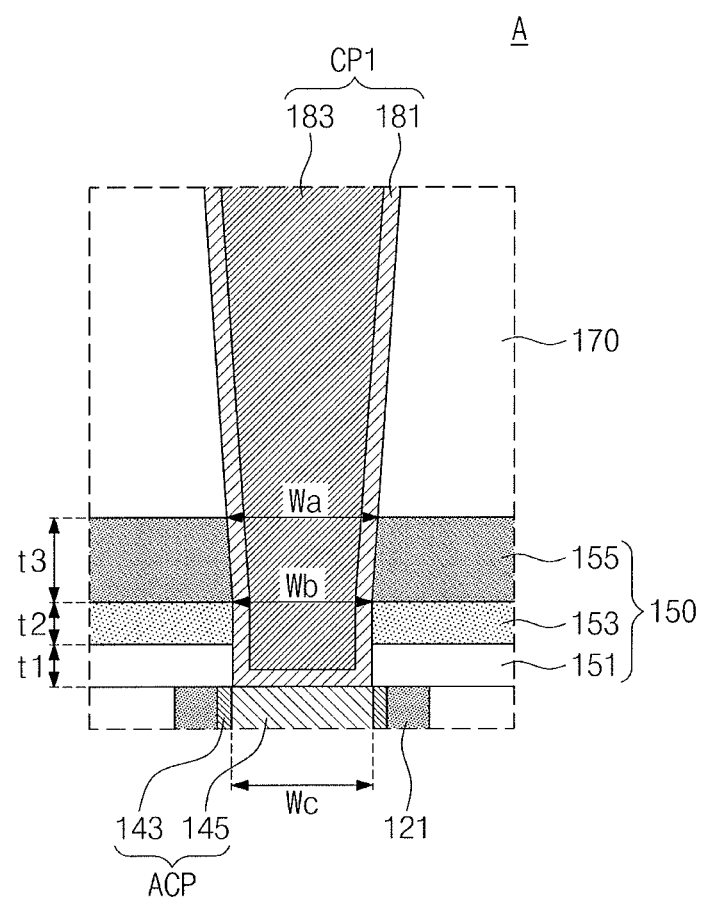
FIGS. 3A, 3B, and 3C illustrate enlarged views of section A shown in FIG. 2.
Figure 3B:
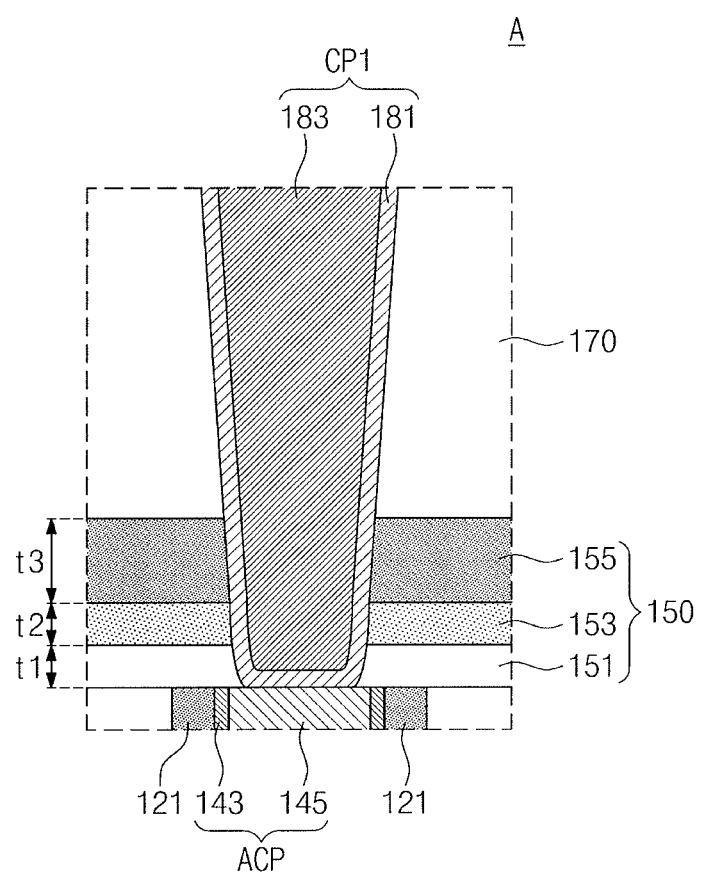
Figure 3C:
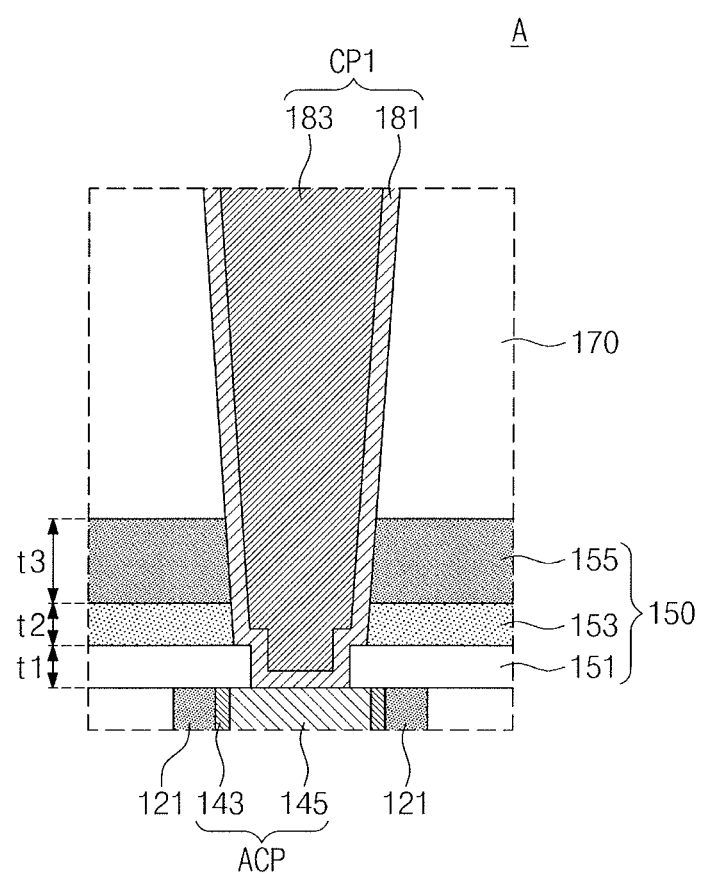

FIG. 1 illustrates a simplified plan view of a semiconductor device according to exemplary embodiments. FIG. 2 illustrates a cross-sectional view taken along line I-I' of FIG. 1, showing a semiconductor device according to exemplary embodiments. FIGS. 3A, 3B, and 3C illustrate enlarged views of section A shown in FIG. 2.

Referring to FIGS. 1 and 2, a semiconductor substrate 100 may include a first region R1 and a second region R2. In an implementation, the semiconductor substrate 100 may be provided thereon with logic devices such as AND gates, OR gates, NOR gates, inverters, or latches. The logic devices may include field effect transistors, resistors, and the like.

The semiconductor substrate 100 may be or include, e.g., a silicon substrate, a germanium substrate, a silicon-on-insulator (SOI) substrate, or a germanium-on-insulator (GOI) substrate. The semiconductor substrate 100 may include a plurality of active patterns 101. The active patterns 101 may be portions of the semiconductor substrate 100 and may be defined by trenches formed on the semiconductor substrate 100. The active patterns 101 may extend in a first direction D1 and may be spaced apart from each other in a second direction D2 intersecting the first direction D1.

A device isolation layer 103 may be disposed between the active patterns 101 adjacent to each other in the second direction D2. The device isolation layer 103 may have a top surface below (e.g., deeper in the substrate 100 than) those of the active patterns 101, which active patterns 101 may protrude upward beyond the top surface of the device isolation layer 103.

Gate structures GS may be disposed on the first and second regions R1 and R2 of the semiconductor substrate 100. The gate structures GS may extend in the second direction D2 across the active patterns 101 and may be spaced apart from each other in the first direction D1. The gate structures GS may have substantially the same width and may be spaced apart from each other at a regular interval. In an implementation, dummy gate structures DGS may be disposed on boundaries between the device isolation layer 103 and the active patterns 101.

Each of the gate structures GS may include, e.g., a gate dielectric layer 111, a metal gate electrode GE, and a capping insulation pattern 117. Gate spacers 121 may be disposed on opposite sidewalls of each of the gate structures GS. The dummy gate structures DGS may have the same stack structure as that of the gate structures GS.

The gate dielectric layer 111 may extend from between the metal gate electrode GE and the active patterns 101 toward between the metal gate electrode GE and the gate spacers 121. For example, the gate dielectric layer 111 may extend from a bottom surface of the metal gate electrode GE onto opposite sidewalls of the metal gate electrode GE. In an implementation, the gate dielectric layer 111 may be locally disposed between the top surface of the active pattern 101 and the bottom surface of the metal gate electrode GE. The gate dielectric layer 111 may include a high-k dielectric material whose dielectric constant is greater than that of silicon oxide. The gate dielectric layer 111 may include, e.g., metal oxide, metal silicate, or metal silicate nitride. As used herein, the term "or" is not an exclusive term.

The metal gate electrode GE may include a gate barrier metal pattern 113 and a gate metal pattern 115. The gate barrier metal pattern 113 may be disposed between the gate dielectric layer 111 and the gate metal pattern 115 and may extend between the gate metal pattern 115 and the gate spacers 121. The gate barrier metal pattern 113 may include conductive metal nitride (e.g., titanium nitride, tantalum nitride, and/or tungsten nitride). The gate metal pattern 115 may include a metallic material (e.g., tungsten, titanium, and/or tantalum).

The capping insulation pattern 117 may cover a top surface of the metal gate electrode GE between a pair of the gate spacers 121. In an implementation, the capping insulation pattern 117 may cover the top surface of the metal gate electrode GE and top surfaces of the gate spacers 121. The capping insulation patterns 117 and the gate spacers 121 may include, e.g., silicon oxide, silicon nitride, silicon oxynitride, silicon carbon nitride (SiCN), or silicon carbon oxynitride (SiCON).

Source/drain impurity layers 130 may be disposed in the active patterns 101 on opposite sides of each of the gate structures GS. The source/drain impurity layers 130 may include n-type or p-type impurities. The source/drain impurity layers 130 may be epitaxial layers grown from the active patterns 101. For example, the source/drain impurity layers 130 may be silicon-germanium (SiGe) epitaxial layers or silicon carbide (SiC) epitaxial layers.

A gap-fill insulation layer 131 may fill between the gate structures GS and cover the source/drain impurity layers 130. In an implementation, the gap-fill insulation layer 131 may have a top surface that is substantially coplanar with those of the gate structures GS. The gap-fill insulation layer 131 may also cover the top surface of the device isolation layer 103.

The gate structures GS may be provided therebetween with active contact patterns ACP that penetrate the gap-fill insulation layer 131 and may be connected to the source/drain impurity layers 130.

Each of the active contact patterns ACP may be either connected to one of the source/drain impurity layers 130 or connected in common to a plurality of the source/drain impurity layers 130. The active contact patterns ACP may include, e.g., cobalt (Co), titanium (Ti), tantalum (Ta), ruthenium (Ru), tungsten (W), or cobalt tungsten phosphorous (CoWP).

Each of the active contact patterns ACP may include a metal silicide layer 141, a first barrier metal layer 143, and a first metal layer 145. The metal silicide layer 141 may be disposed between the first barrier metal layer 143 and the source/drain impurity layers 130. The metal silicide layer 141 may include, e.g., nickel silicide, cobalt silicide, tungsten silicide, titanium silicide, niobium silicide, or tantalum silicide. The first barrier metal layer 143 may have a uniform thickness and may conformally cover a top surface of the source/drain impurity layer 130. The first barrier metal layer 143 may include conductive metal nitride, e.g., titanium nitride, tantalum nitride, or tungsten nitride. The first metal layer 145 may include a metallic material, e.g., cobalt (Co), titanium (Ti), tantalum (Ta), ruthenium (Ru), tungsten (W), or cobalt tungsten phosphorous (CoWP).

Figure 8:
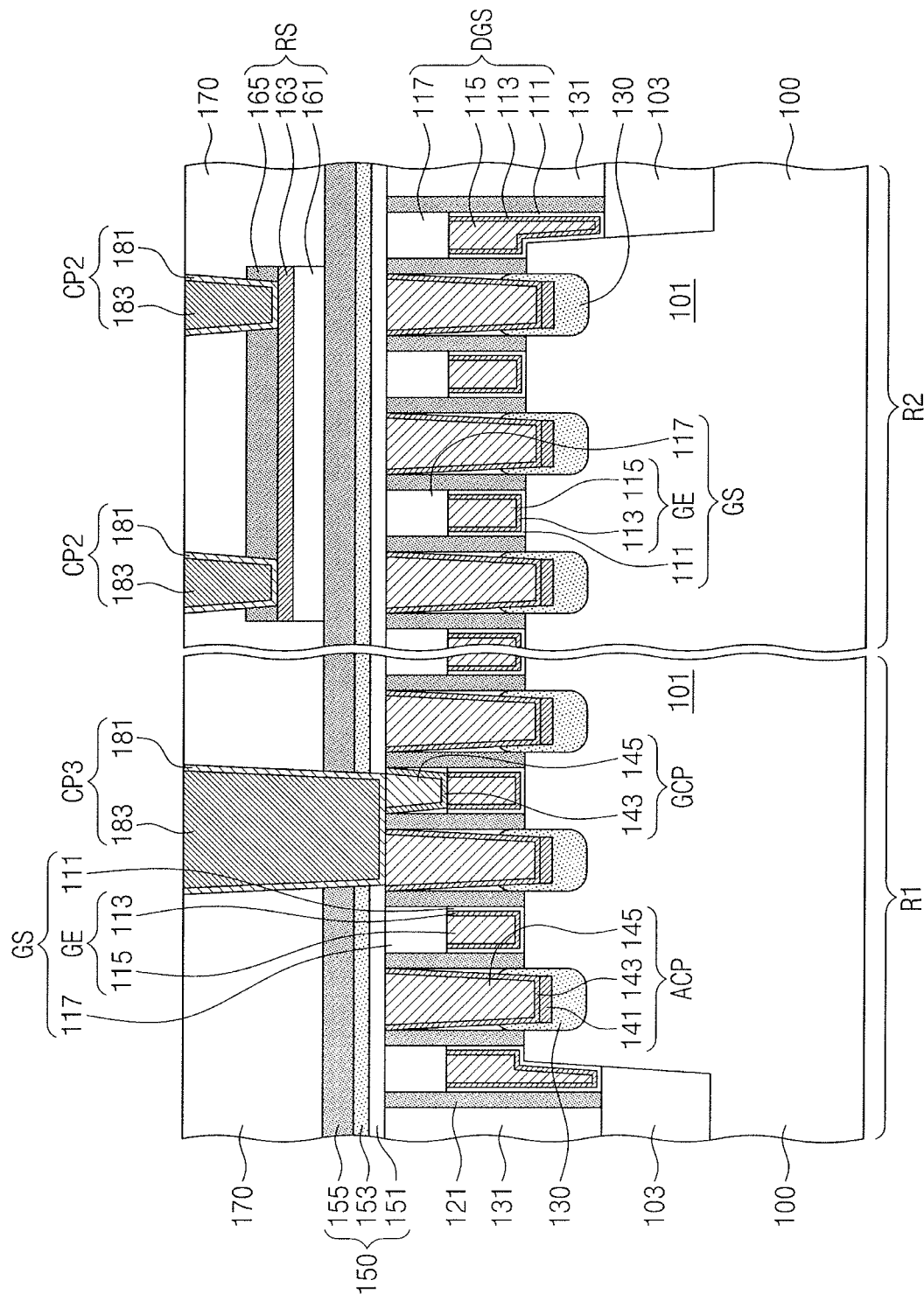
FIGS. 8 and 9 illustrate cross-sectional views showing a semiconductor device according to exemplary embodiments.

The metal gate electrodes GE may be connected to gate contact patterns GCP penetrating the gap-fill insulation layer 131 and the capping insulation patterns 117 of the gate structures GS. The gate contact patterns GCP may be formed simultaneously with the active contact patterns ACP and may include the same metallic material as that of the active contact patterns ACP. Likewise, in the active contact patterns ACP, as illustrated in FIG. 8, each of the gate contact patterns GCP may include a first barrier metal layer 143 and a first metal layer 145. The first barrier metal layer 143 of the gate contact pattern GCP may have a uniform thickness and may be interposed between the first metal layer 145 and the gate metal pattern 115. The gate contact patterns GCP may have top surfaces that are substantially coplanar with those of the active contact patterns ACP.

In an implementation, the semiconductor substrate 100 may be covered on its entire surface with an etch stop layer 150 having a uniform thickness. On the first and second regions R1 and R2, the etch stop layer 150 may cover the top surfaces of the active contact patterns ACP and the top surfaces of the gate contact patterns GCP. The etch stop layer 150 may have a substantially uniform thickness on the first and second regions R1 and R2.

The etch stop layer 150 may include, e.g., a first insulation layer 151, a second insulation layer 153, and a third insulation layer 155 that are sequentially stacked. The first insulation layer 151 may be formed of a first insulating material, and the second insulation layer 153 may be formed of a second insulating material that is different from the first insulating material. The third insulation layer 155 may be formed of a third insulating material that is different from the first and second insulating materials.

For example, referring to FIGS. 2 and 3A, the first insulation layer 151 may include a metallic element and nitrogen. In an implementation, the metallic element contained in the first insulation layer 151 may include, e.g., aluminum (Al), titanium (Ti), tantalum (Ta), cobalt (Co), gallium (Ga), strontium (Sr), yttrium (Y), zirconium (Zr), niobium (Nb), ruthenium (Ru), indium (In), barium (Ba), lanthanum (La), hafnium (Hf), tantalum (Ta), tungsten (W), or iridium (Ir). In an implementation, the first insulation layer 151 may be formed of a substantially oxygen-free material. In this description, the term "oxygen-free" may mean that no oxygen is substantially included, or no oxygen is intentionally included in a process. In an implementation, the first insulation layer 151 may be formed of aluminum nitride and may have a first thickness t1 ranging from, e.g., about 10 Å to about 80 Å.

In an implementation, the second insulation layer 153 may be formed of a carbon-containing insulating material, e.g., a SiC layer, a SiCN layer, a SiOC layer, or a SiCON layer. The second insulation layer 153 may have a second thickness t2 that is substantially the same as the first thickness t1 of the first insulation layer 151. In an implementation, the second thickness t2 of the second insulation layer 153 may be different from the first thickness t1 of the first insulation layer 151. In an implementation, the second thickness t2 of the second insulation layer 153 may fall within a range, e.g., from about 10 Å to about 80 Å.

The third insulation layer 155 may be formed of an insulating material that does not contain a metallic element and carbon. In an implementation, the third insulation layer 155 may be formed of an insulating material that does not contain a metallic element and does not contain carbon. In an implementation, the third insulation layer 155 may be formed of an oxygen-free material. For example, the third insulation layer 155 may be formed of silicon nitride and may have a third thickness t3 that is greater than both the first thickness t1 of the first insulation layer 151 and the second thickness t2 of the second insulation layer 153. In an implementation, the third thickness t3 of the third insulation layer 155 may be greater than a sum (t1+t2) of the first and second thickness t1 and t2 respectively of the first and second insulation layers 151 and 153. In an implementation, the third thickness t3 of the third insulation layer 155 may fall within a range, e.g., from about 50 Å to about 150 Å.

In an implementation, a resistance structure RS may be disposed on the etch stop layer 150 of the second region R2. For example, the resistance structure RS may be disposed on the third insulation layer 155. The resistance structure RS may include a buffer insulation pattern 161, a resistance conductive pattern 163, and a hardmask pattern 165 that are sequentially stacked. In an implementation, when viewed in plan, the resistance structure RS may overlap the gate structures GS, the active contact patterns ACP, and/or the gate contact patterns GCP.

The buffer insulation pattern 161 may be formed of an insulating material having an etch selectivity with respect to the third insulation layer 155, which insulating material may be different from that of the third insulation layer 155. In an implementation, the buffer insulation pattern 161 may include, e.g., silicon oxide, silicon nitride, silicon oxynitride, silicon carbon nitride (SiCN), or silicon carbon oxynitride (SiCON).

The resistance conductive pattern 163 may be thinner than the buffer insulation pattern 161 and the hardmask pattern 165. In an implementation, the resistance conductive pattern 163 may include conductive metal nitride, e.g., titanium nitride, tantalum nitride, and/or tungsten nitride. In an implementation, the resistance conductive pattern 163 may include a metallic material, e.g., tungsten, aluminum, titanium, and/or tantalum.

The hardmask pattern 165 may be formed of an insulating material that is different from that of the buffer insulation pattern 161. In an implementation, the hardmask pattern 165 may be formed of, e.g., one of SiN, SiON, SiCN, and SiC.

An interlayer dielectric layer 170 may be disposed on the etch stop layer 150 of the first and second regions R1 and R2, and may cover the resistance structure RS on the second region R2. The interlayer dielectric layer 170 may have a top surface that is positioned at substantially the same level on the first and second regions R1 and R2. The interlayer dielectric layer 170 may include one or a plurality of insulation layers.

The interlayer dielectric layer 170 may be formed of an insulating material having an etch selectivity with respect to the etch stop layer 150, which insulating material may include, e.g., a silicon oxide layer, a silicon nitride layer, or a silicon oxynitride layer. In an implementation, the interlayer dielectric layer 170 may be formed of a low-k dielectric material whose dielectric constant is less than that of a silicon oxide layer. For example, the interlayer dielectric layer 170 may have a dielectric constant ranging from about 1.0 to about 3.0, and may include an inorganic material, an organic material, or an organic-inorganic hybrid material. In an implementation, the interlayer dielectric layer 170 may be formed of, e.g., an impurity doped silicon oxide-based material or a low-k organic polymeric material.

On the first region R1, at least one of the active contact patterns ACP may be connected to a first contact plug CP1 that penetrates the interlayer dielectric layer 170 and the etch stop layer 150. The first contact plug CP1 may include a second barrier metal layer 181 and a second metal layer 183, which second barrier metal layer 181 may be interposed between the second metal layer 183 and the active contact pattern ACP. In an implementation, the second barrier metal layer 181 may include a conductive metal nitride, e.g., titanium nitride, tantalum nitride, or tungsten nitride. In an implementation, the second metal layer 183 may include a metallic material, e.g., tantalum (Ta), ruthenium (Ru), cobalt (Co), manganese (Mn), titanium (Ti), tungsten (W), nickel (Ni), or aluminum (Al). In an implementation, the second metal layer 183 may include, e.g., copper or a copper alloy.

Referring to FIG. 3A, the first contact plug CP1 may include an upper segment penetrating the interlayer dielectric layer 170 and a lower segment penetrating the etch stop layer 150. An angle between a sidewall of the lower segment and a top surface of the semiconductor substrate 100 may be different from an angle between a sidewall of the upper segment and the top surface of the semiconductor substrate 100. For example, the first contact plug CP1 may have a tapered sidewall surrounded by the third insulation layer 155 and the interlayer dielectric layer 170 and may also have a substantially vertical sidewall with respect to a bottom surface of the etch stop layer 150, which substantially vertical sidewall is surrounded by the first and second insulation layers 151 and 153.

The first contact plug CP1 may have a width that is smaller at its bottom surface than at its top surface. For example, the first contact plug CP1 may have a first width Wa at a top surface of the third insulation layer 155 and a second width Wb at a top surface of the second insulation layer 153, which second width Wb is less than the first width Wa. The first contact plug CP1 may have a third width Wc at a bottom surface of the first insulation layer 151, which third width Wc is substantially the same as the second width Wb.

Referring to FIG. 3B, in an implementation, the first contact plug CP1 may have a tapered sidewall surrounded by the interlayer dielectric layer 170, the second insulation layer 153, and the third insulation layer 155 and a rounded lower sidewall surrounded by the first insulation layer 151.

Referring to FIG. 3C, in an implementation, the first contact plug CP1 may have a stepped sidewall surrounded by the etch stop layer 150. The first contact plug CP1 may have a larger width surrounded by the first insulation layer 151 and a smaller width surrounded by the second insulation layer 153 or the third insulation layer 155.

Referring back to FIGS. 1 and 2, on the second region R2, second contact plugs CP2 may penetrate the interlayer dielectric layer 170 and connected to the resistance structure RS. For example, the second contact plugs CP2 may penetrate the hardmask pattern 165 to be in contact with the resistance conductive pattern 163 of the resistance structure RS. The second contact plugs CP2 may be formed of the same metallic material as that of the first contact plug CP1, and may include a second barrier metal layer 181 and a second metal layer 183, likewise the first contact plug CP1. The second contact plugs CP2 may have top surfaces at substantially the same level as that of the top surface of the first contact plug CP1. Each of the second contact plugs CP1 may have a height less than that of the first contact plug CP1. The second contact plug CP2 may be greater in width and/or length than the first contact plug CP1.

FIGS. 4 to 7 illustrate cross-sectional views taken along line I-I' of FIG. 1, showing a semiconductor device according to exemplary embodiments. The same technical features as those of the embodiments discussed above with reference to FIGS. 1, 2, and 3A to 3C may be omitted in the interest of brevity of description.

Figure 4:
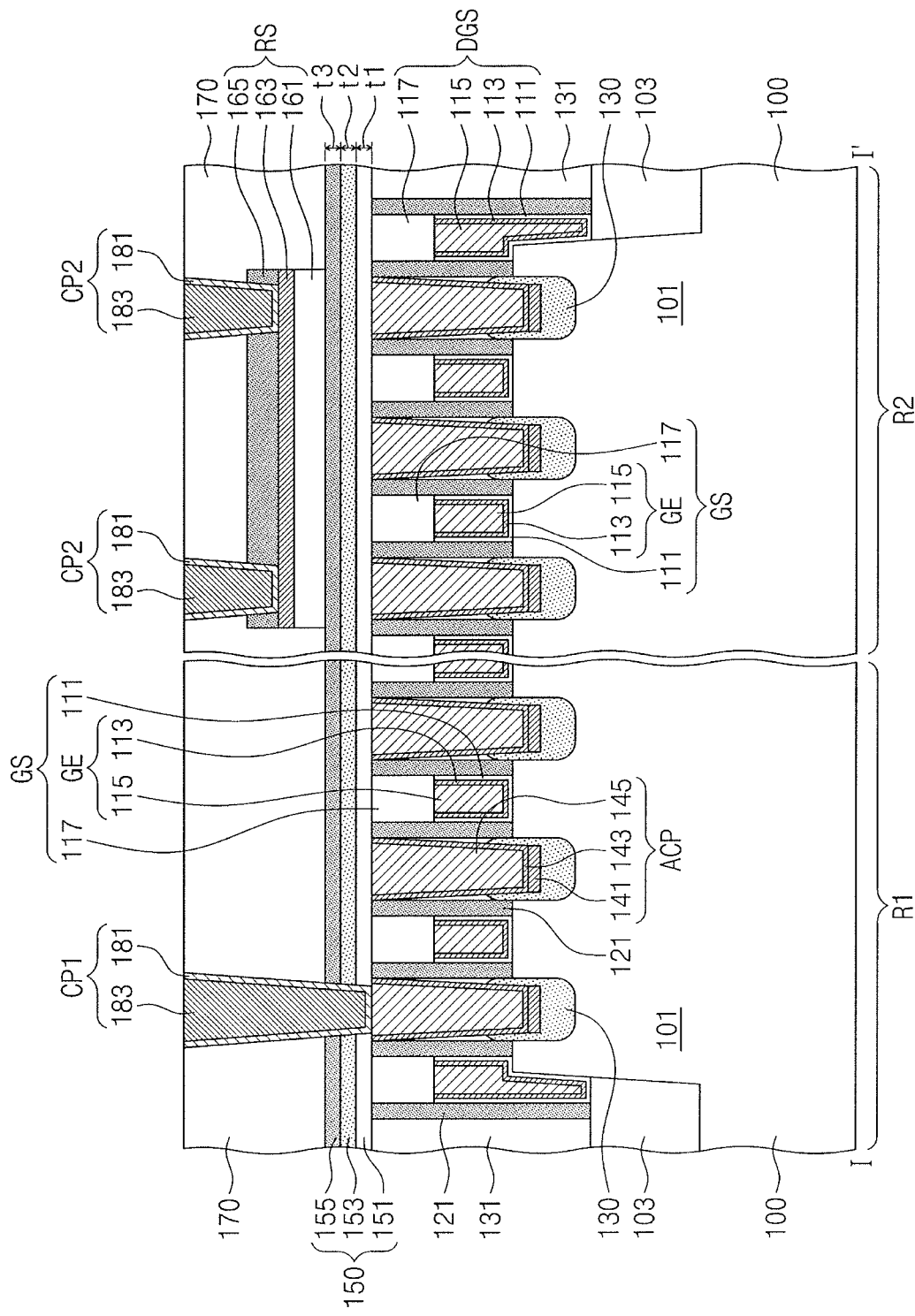
FIGS. 4 to 7 illustrate cross-sectional views taken along line I-I' of FIG. 1, showing a semiconductor device according to exemplary embodiments.

Referring to FIG. 4, the etch stop layer 150 may cover the top surfaces of the gate structures GS, the top surface of the active contact patterns ACP, and the top surfaces of the gate contact patterns GCP. The etch stop layer 150 may have a substantially uniform thickness on the entire surface of the semiconductor substrate 100. The etch stop layer 150 may include first to third insulation layers 151, 153, and 155 that are sequentially stacked, and the third insulation layer 155 may have a third thickness t3 that is substantially the same as either a first thickness t1 of the first insulation layer 151 or a second thickness t2 of the second insulation layer 153.

Figure 5:
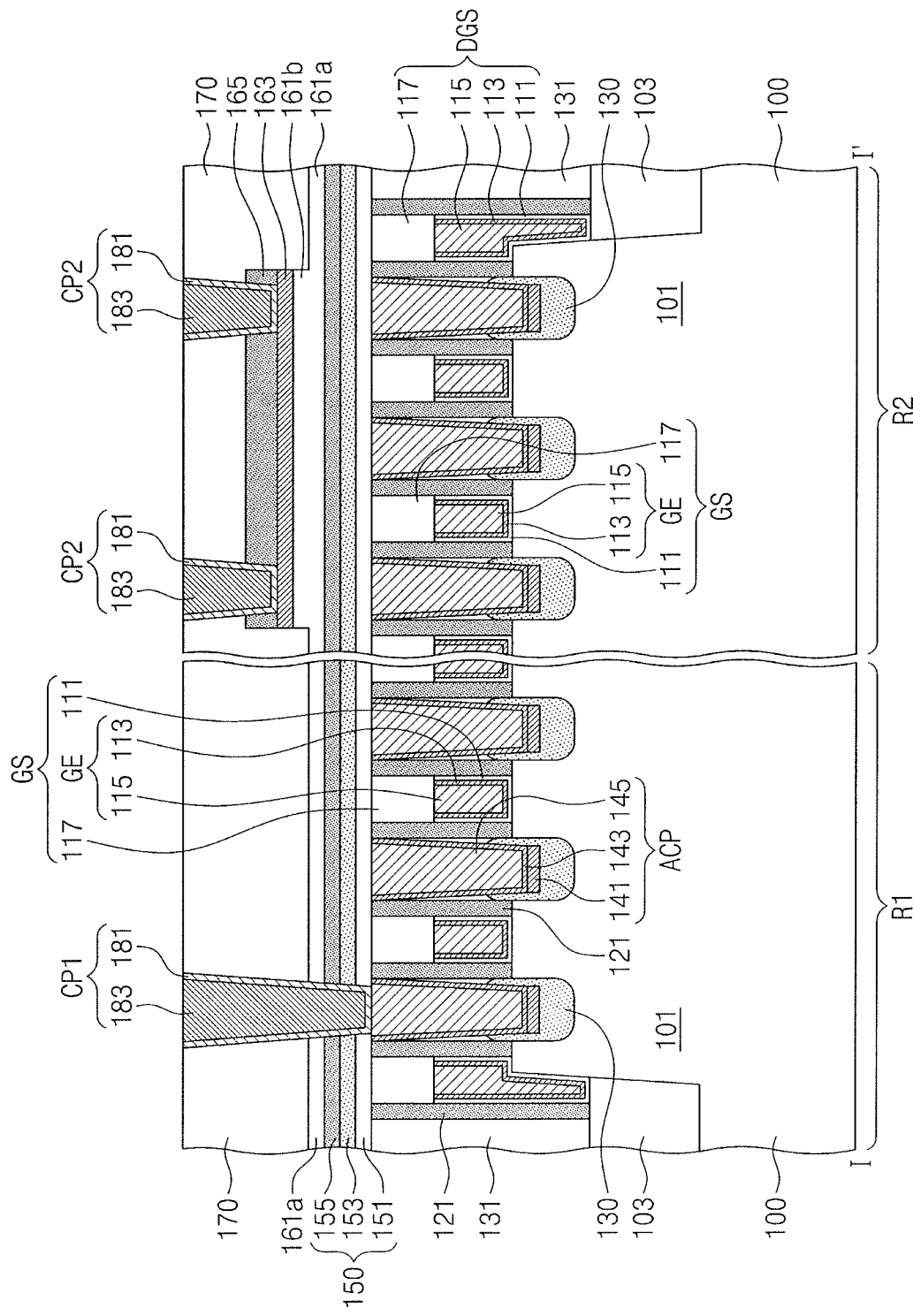

Referring to FIG. 5, a buffer insulation layer 161a and 161b may be disposed on the etch stop layer 150 covering the entire surface of the semiconductor substrate 100. The buffer insulation layer 161a and 161b may cover the entire surface of the semiconductor substrate 100, and may include a first segment 161a having a first thickness and a second segment 161b having a second thickness that is greater than the first thickness. The second segment 161b of the buffer insulation layer 161a and 161b may overlap the resistance conductive pattern 163.

Figure 6:
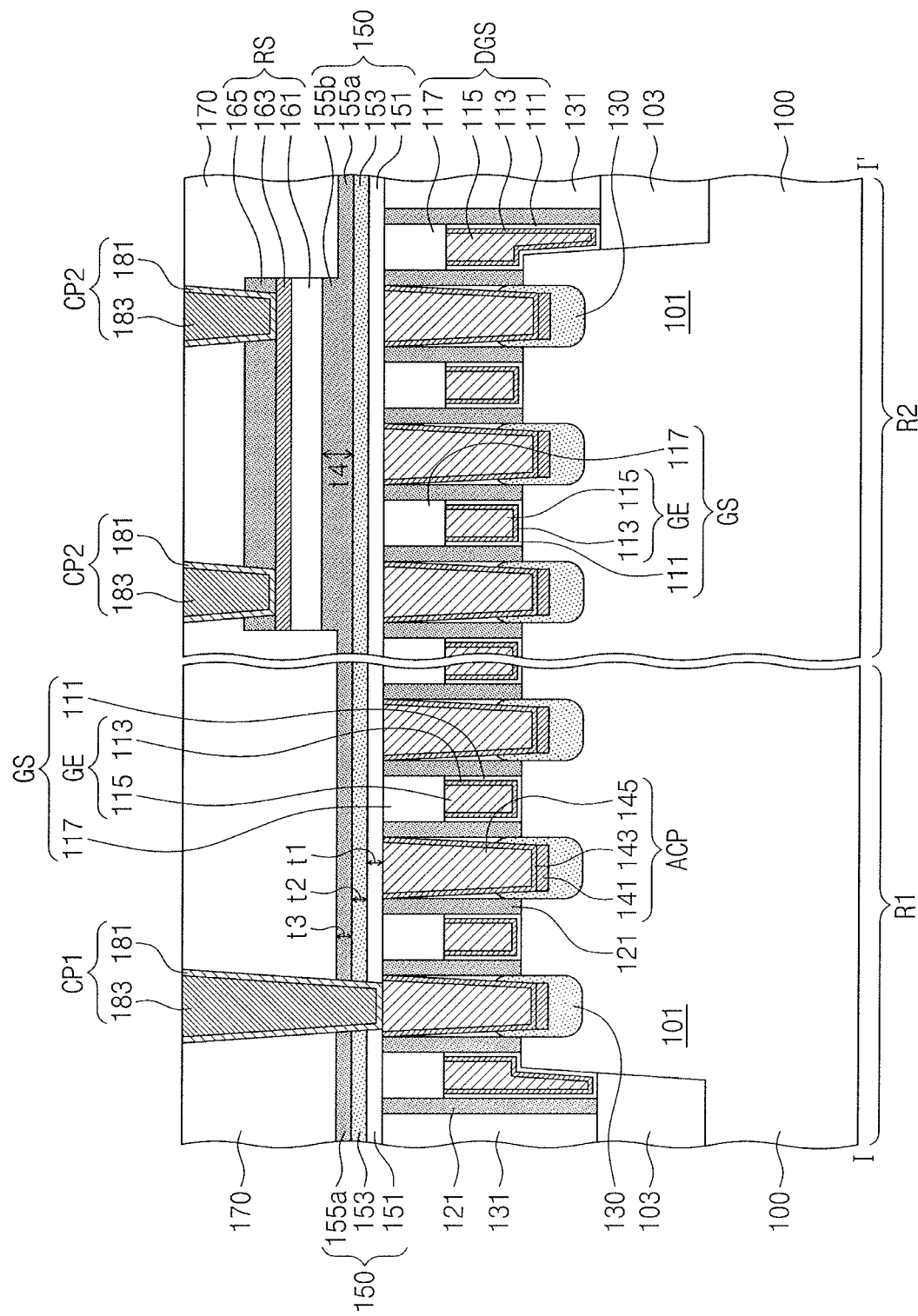
Figure 7:
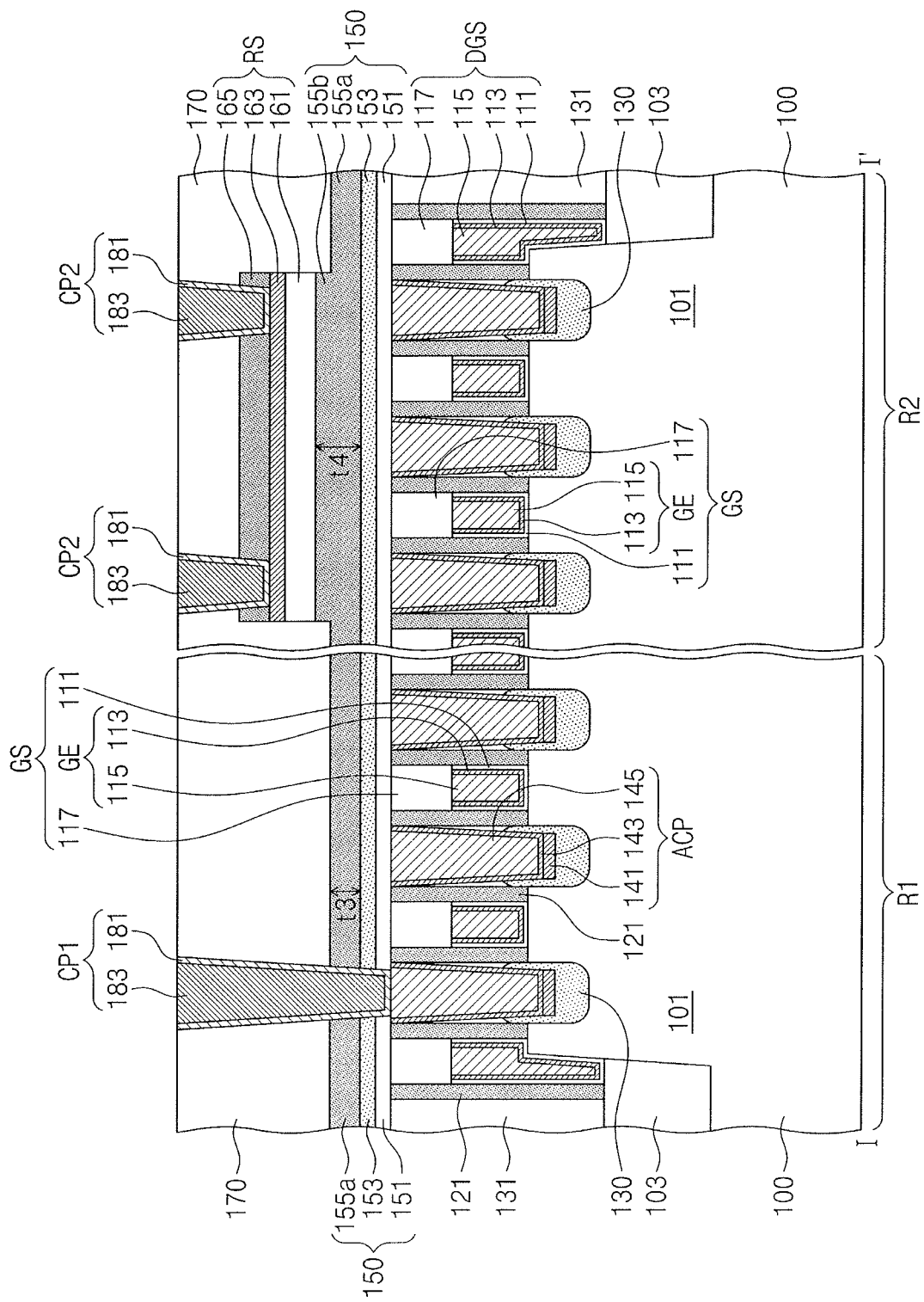

Referring to FIGS. 6 and 7, the etch stop layer 150 may include a first insulation layer 151, a second insulation layer 153, and a third insulation layer 155a and 155b, which insulation layers 151, 153, 155a, and 155b are sequentially stacked. The first insulation layer 151 may have a first thickness t1 that is substantially uniform on the first and second regions R1 and R2, and the second insulation layer 153 may have a second thickness t2 that is substantially uniform on the first and second regions R1 and R2. The third insulation layer 155a and 155b may include a first segment 155a (which completely covers the semiconductor substrate 100) having a third thickness t3, and a second segment 155b having a fourth thickness t4 that is greater than the third thickness t3. The second segment 155b of the third insulation layer 155a and 155b may overlap the resistance structure RS.

In an implementation, referring to FIG. 6, the third thickness t3 of the first segment 155a of the third insulation layer 155a and 155b may be substantially the same as either the first thickness t1 of the first insulation layer 151 or the second thickness t2 of the second insulation layer 153. In an implementation, referring to FIG. 7, the third thickness t3 of the first segment 155a of the third insulation layer 155a and 155b may be greater than either the first thickness t1 of the first insulation layer 151 or the second thickness t2 of the second insulation layer 153.

Figure 9:
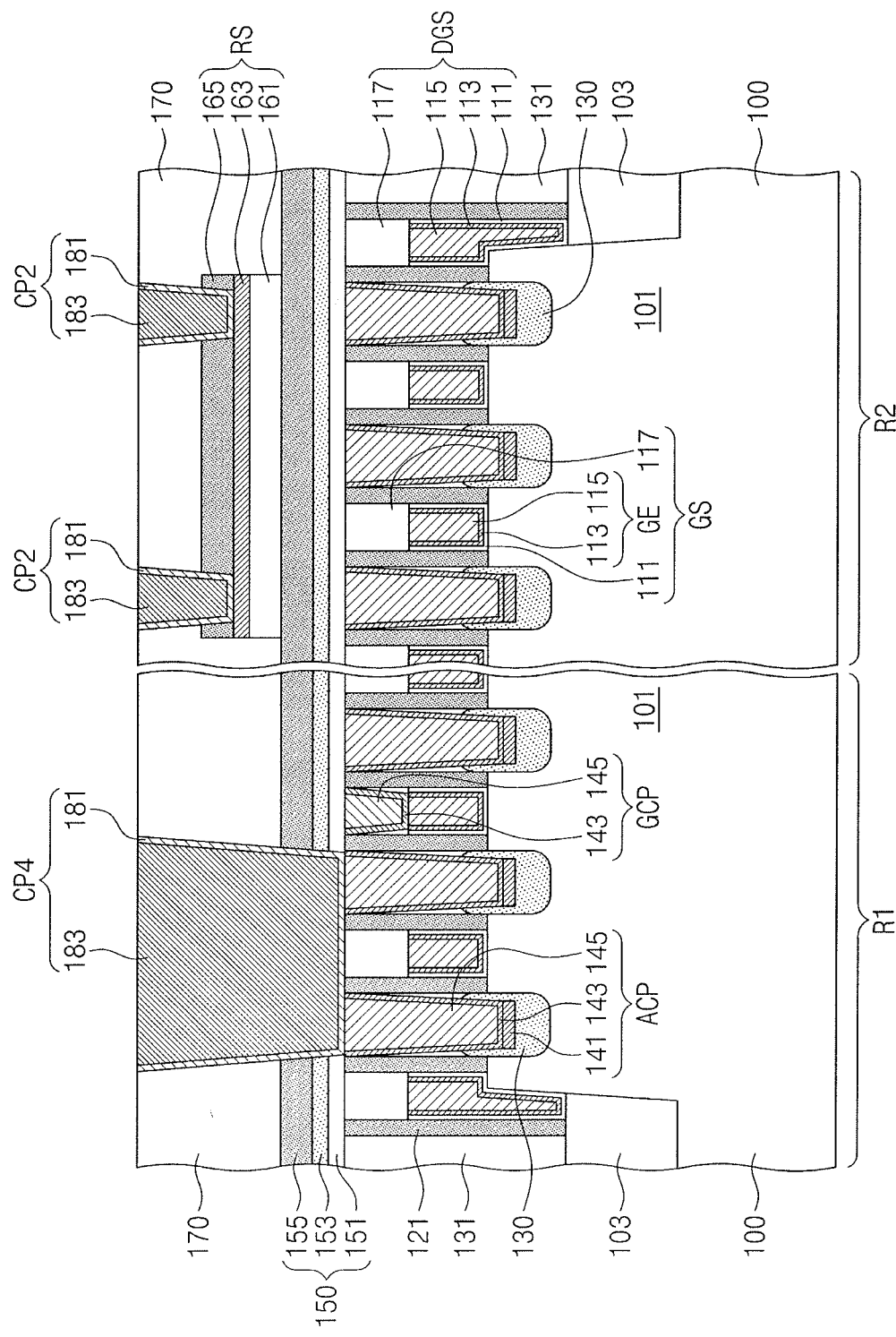

FIGS. 8 and 9 illustrate cross-sectional views showing a semiconductor device according to exemplary embodiments. The same technical features as those of the embodiments discussed above with reference to FIGS. 1, 2, and 3A to 3C may be omitted in the interest of brevity of description.

In an implementation, as shown in FIG. 8, on the first region R1, the active contact pattern ACP and the gate contact pattern GCP may be commonly connected to a third contact plug CP3 that penetrates the interlayer dielectric layer 170 and the etch stop layer 150. Likewise the first contact plug CP1 discussed above, the third contact plug CP3 may include a second barrier metal layer 181 and a second metal layer 183. The third contact plug CP3 may have a top surface at substantially the same level as those of the top surfaces of the second contact plugs CP2.

In an implementation, as shown in FIG. 9, on the first region R1, the active contact patterns ACP spaced apart from each other may be commonly connected to a fourth contact plug CP4 that penetrates the interlayer dielectric layer 170 and the etch stop layer 150. Likewise the first contact plug CP1 discussed above, the fourth contact plug CP4 may include a second barrier metal layer 181 and a second metal layer 183. The fourth contact plug CP4 may have a top surface at substantially the same level as those of the top surfaces of the second contact plugs CP2.

FIGS. 10 to 14 illustrate cross-sectional views taken along line I-I' of FIG. 1, showing stages in a method of fabricating a semiconductor device according to exemplary embodiments.

Figure 10:
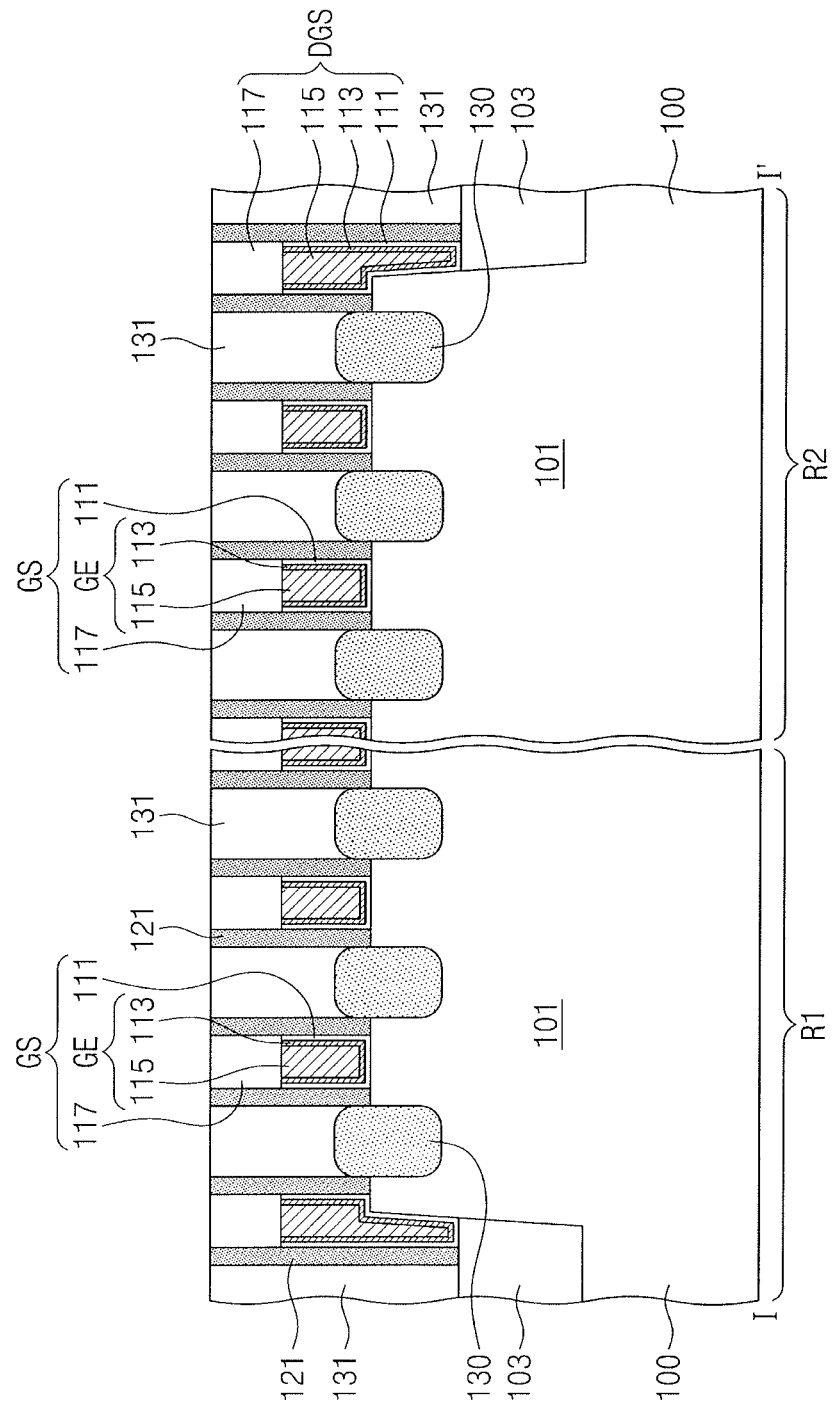
FIGS. 10 to 14 illustrate cross-sectional views taken along line I-I' of FIG. 1, showing stages in a method of fabricating a semiconductor device according to exemplary embodiments.

Referring to FIGS. 1 and 10, a device isolation layer 103 may be formed to define active patterns 101 extending in a first direction D1. The formation of the device isolation layer 103 may include patterning a semiconductor substrate 100 to form trenches, forming an insulation layer to fill the trenches, and recessing the insulation layer to have a top surface below a top surface of the semiconductor substrate 100. The semiconductor substrate 100 may include a first region R1 and a second region R2.

Gate structures GS may cross the active patterns 101. The formation of the gate structures GS may include forming dummy gate patterns crossing the active patterns 101, forming gate spacers 121 on opposite sidewalls of each of the dummy gate patterns, forming a gap-fill insulation layer 131 to fill between the dummy gate patterns, replacing the dummy gate patterns with metal gate electrodes GE, and forming capping insulation patterns 117 on the metal gate electrodes GE. The replacement of the dummy gate patterns with the metal gate electrodes GE may include removing the dummy gate patterns to form in a pair of the gate spacers 121 a recess region that exposes top surfaces of the active patterns 101 and sequentially forming a gate barrier metal layer and a gate metal layer in the recess region.

Prior to the replacement of the dummy gate patterns with the metal gate electrodes GE, source/drain impurity layers 130 may be formed in the active patterns 101 on opposite sides of each of the dummy gate patterns. The source/drain impurity layers 130 may be epitaxial layers formed by an epitaxial growth process. The source/drain impurity layers 130 may be, e.g., silicon-germanium (SiGe) epitaxial layers or silicon carbide (SiC) epitaxial layers. The source/drain impurity layer 130 may have a top surface at a higher level than that of a top surface of the active pattern 101. The source/drain impurity layer 130 may have an inclined sidewall.

Figure 11:
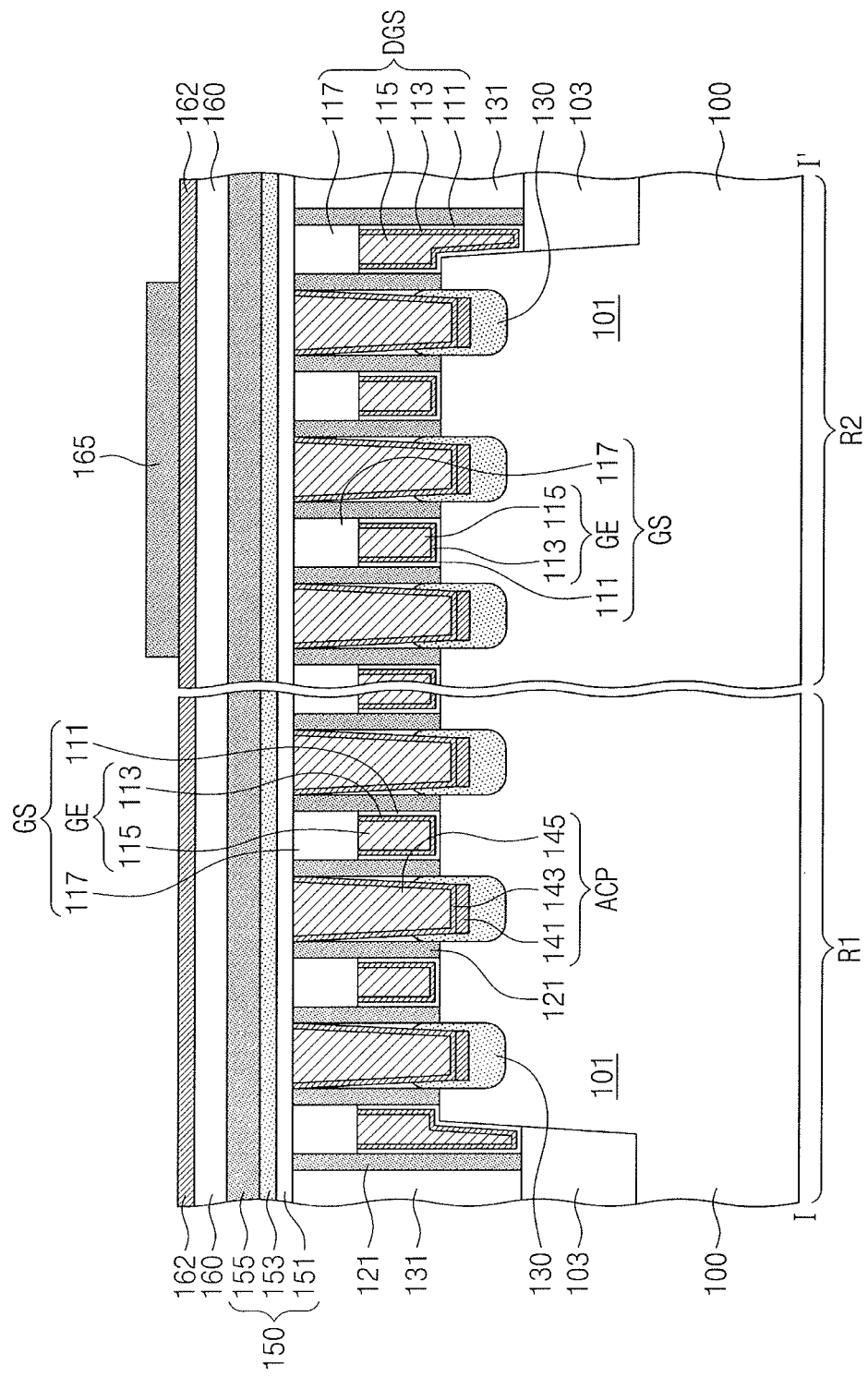

Referring to FIGS. 1 and 11, active contact patterns ACP may be formed to penetrate the gap-fill insulation layer 131 and connected to the source/drain impurity layers 130, and gate contact patterns GCP may be formed to penetrate the gap-fill insulation layer 131 and connected to the metal gate electrodes GE.

The formation of the active contact patterns ACP and the gate contact patterns GCP may include forming a mask pattern on the gap-fill insulation layer 131 and the gate structures GS, using the mask pattern as an etching mask to anisotropically etch the gap-fill insulation layer 131 to form first contact holes exposing the source/drain impurity layers 130 and to form second contact holes exposing the metal gate electrodes GE, sequentially depositing a metal barrier layer and a metal layer in the first and second contact holes, and planarizing the metal barrier layer and the metal layer. The source/drain impurity layers 130 may be partially etched when the first contact holes are formed.

For the active contact patterns ACP and the gate contact patterns GCP, the metal barrier layer may be formed of conductive metal nitride, e.g., titanium nitride, tantalum nitride, or tungsten nitride. In an implementation, the metal layer may be formed of, e.g., cobalt (Co), titanium (Ti), tantalum (Ta), ruthenium (Ru), tungsten (W), or cobalt tungsten phosphorous (CoWP). When the active contact patterns ACP are formed, a metallic material may react with the source/drain impurity layer 130 to form a metal silicide layer 141 between a first barrier metal layer 143 and the source/drain impurity layer 130.

After the active contact patterns ACP and the gate contact patterns GCP are formed, an etch stop layer 150 may be formed on an entire surface of the semiconductor substrate 100. The etch stop layer 150 may be formed by sequentially depositing a first insulation layer 151, a second insulation layer 153, and a third insulation layer 155. In an implementation, the first insulation layer 151 may be in direct contact with top surfaces of the active contact patterns ACP and top surfaces of the gate contact patterns GCP.

The first to third insulation layers 151, 153, and 155 may be formed using a layer-formation technique with an excellent step coverage property or superior thin-film conformality, e.g., chemical vapor deposition (CVD) or atomic layer deposition (ALD).

In an implementation, the first insulation layer 151 may be formed of a first insulating material that includes a metallic element and nitrogen. In an implementation, the first insulation layer 151 may be formed of a substantially oxygen-free material. In an implementation, the first insulation layer 151 may be formed by depositing aluminum nitride to a uniform thickness. The first insulation layer 151 may help prevent the active contact patterns ACP and the gate contact patterns GCP from being damaged or lost during subsequent processes.

In an implementation, the second insulation layer 153 may be formed of a second insulating material that contains carbon. In an implementation, the second insulation layer 153 may be formed by depositing SiOC to a uniform thickness. The second insulation layer 153 may help prevent the active contact patterns ACP and the gate contact patterns GCP from being attacked by oxygen or moisture during subsequent processes.

In an implementation, the third insulation layer 155 may be formed of a third insulating material that does not contain a metallic element and carbon. In an implementation, the third insulation layer 155 may be formed by depositing silicon nitride to a uniform thickness. In an implementation, the third insulation layer 155 may be deposited thicker than the first and second insulation layers 151 and 153.

A buffer insulation layer 160 and a resistance conductive layer 162 may be sequentially deposited on the etch stop layer 150.

The buffer insulation layer 160 may be formed of an insulating material that has an etch selectivity with respect to the third insulation layer 155. In an implementation, the buffer insulation layer 160 may include, e.g., silicon oxide, silicon nitride, silicon oxynitride, silicon carbon nitride (SiCN), or silicon carbon oxynitride (SiCON).

In an implementation, the resistance conductive layer 162 may be formed of, e.g., a polysilicon layer, a metal silicide layer, a conductive metal nitride layer, or a metal layer. The resistance conductive layer 162 may be thinner than the buffer insulation layer 160.

A hardmask pattern 165 may be formed on the resistance conductive layer 162 of the second region R2. In an implementation, the hardmask pattern 165 may be formed of an insulating material, e.g., a silicon nitride layer or a silicon oxynitride layer, that has an etch selectivity with respect to the resistance conductive layer 162.

Figure 12:
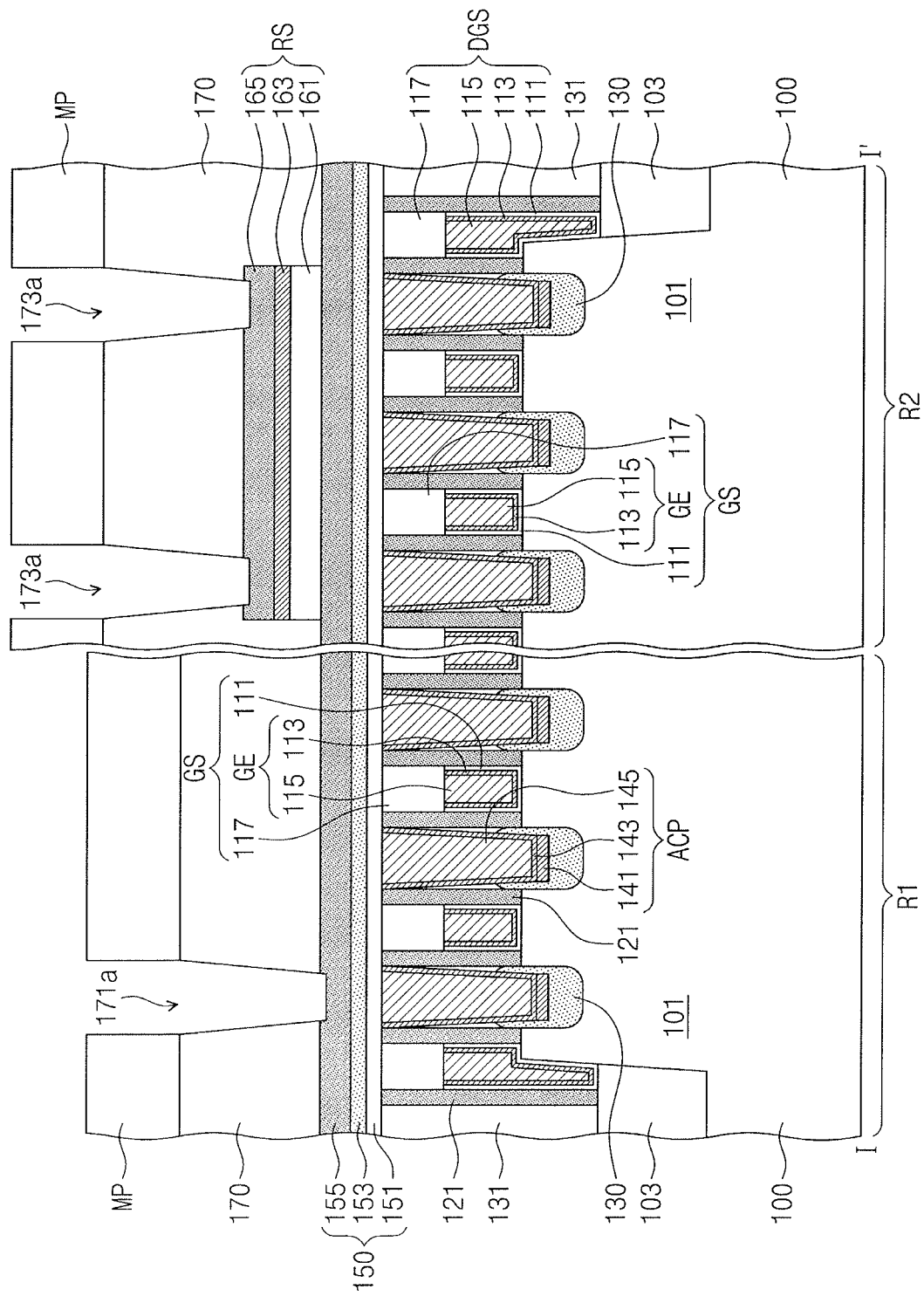

Referring to FIG. 12, the hardmask pattern 165 may be used as an etching mask for an etching process in which the resistance conductive layer 162 and the buffer insulation layer 160 are sequentially etched to form a resistance conductive pattern 163 and a buffer insulation pattern 161 that are provided on the second region R2. The third insulation layer 155 may serve as an etch stop layer during the etching process that forms the buffer insulation pattern 161 and the resistance conductive pattern 163. In an implementation, when the resistance conductive pattern 163 is formed, a portion of the buffer insulation layer 160 may remain on the first region R1, as illustrated in FIG. 5. In an implementation, when the resistance conductive pattern 163 and the buffer insulation pattern 161 are formed, the third insulation layer 155 may be recessed on its top surface exposed through the buffer insulation pattern 161, as illustrated in FIGS. 6 and 7.

The formation of the resistance conductive pattern 163 and the buffer insulation pattern 161 may result in forming a resistance structure RS that overlaps portions of the gate structures GS on the second region R2.

An interlayer dielectric layer 170 may be formed on the entire surface of the semiconductor substrate 100. The interlayer dielectric layer 170 may cover the etch stop layer 150 and the resistance structure RS. The interlayer dielectric layer 170 may include one or more insulation layers.

The interlayer dielectric layer 170 may be formed using a deposition process, e.g., plasma enhanced chemical vapor deposition (PECVD), high density plasma (HDP) CVD, or sputtering. The deposition process may deposit the interlayer dielectric layer 170 to a uniform thickness on the first and second regions R1 and R2. The interlayer dielectric layer 170 may cover the resistance structure R2 on the second region R2, and thus have a top surface whose level is higher on the second region R2 than on the first region R1.

The interlayer dielectric layer 170 may be formed of an insulating material that has an etch selectivity with respect to the etch stop layer 150 and the hardmask pattern 165 of the resistance structure RS. In an implementation, the interlayer dielectric layer 170 may include, e.g., a silicon oxide layer, a silicon nitride layer, a silicon oxynitride layer, or a low-k dielectric layer. In an implementation, the interlayer dielectric layer 170 may include a silicon oxide layer, e.g., a high density plasma (HDP) oxide layer or a plasma enhanced tetraethylorthosilicate (PE-TEOS) layer. In an implementation, the interlayer dielectric layer 170 may be formed of a dielectric material whose dielectric constant is less than that of a silicon oxide layer. In an implementation, the interlayer dielectric layer 170 may have a dielectric constant ranging from about 1.0 to about 3.0, and may include, e.g., an inorganic material, an organic material, or an organic-inorganic hybrid material.

The interlayer dielectric layer 170 may be provided thereon with a mask pattern MP having openings through which the interlayer dielectric layer 170 is exposed on the first and second regions R1 and R2. The mask pattern MP may include, e.g., a spin-on-hardmask (SOH) layer or an amorphous carbon layer (ACL). The SOH layer may include a carbon-based SOH layer or a silicon-based SOH layer. The mask pattern MP may have a thickness that is variable based on thickness and material of the interlayer dielectric layer 170.

The mask pattern MP may be used as an etching mask to perform a first etching process on the interlayer dielectric layer 170. The first etching process may employ an etch recipe or etchant that has an etch selectivity with respect to the third insulation layer 155 and the hardmask pattern 165. The first etching process may form a first opening 171a that exposes the third insulation layer 155 on the first region R1 and second openings 173a that expose the hardmask pattern 165 on the second region R2.

After the first etching process is performed, a mask pattern removal process may be performed to remove the mask pattern MP on the interlayer dielectric layer 170. When the mask pattern MP is formed of an SOH layer, the mask pattern MP may be removed by an ashing process and/or a stripping process. The first etching process and the mask pattern removal process may use an etchant or a process gas including oxygen or fluorine. The third insulation layer 155 may help prevent the active contact patterns ACP and the gate contact patterns GCP from being permeated or infiltrated with the etchant or the process gas that is used in the first etching process and the mask pattern removal process.

Figure 13:
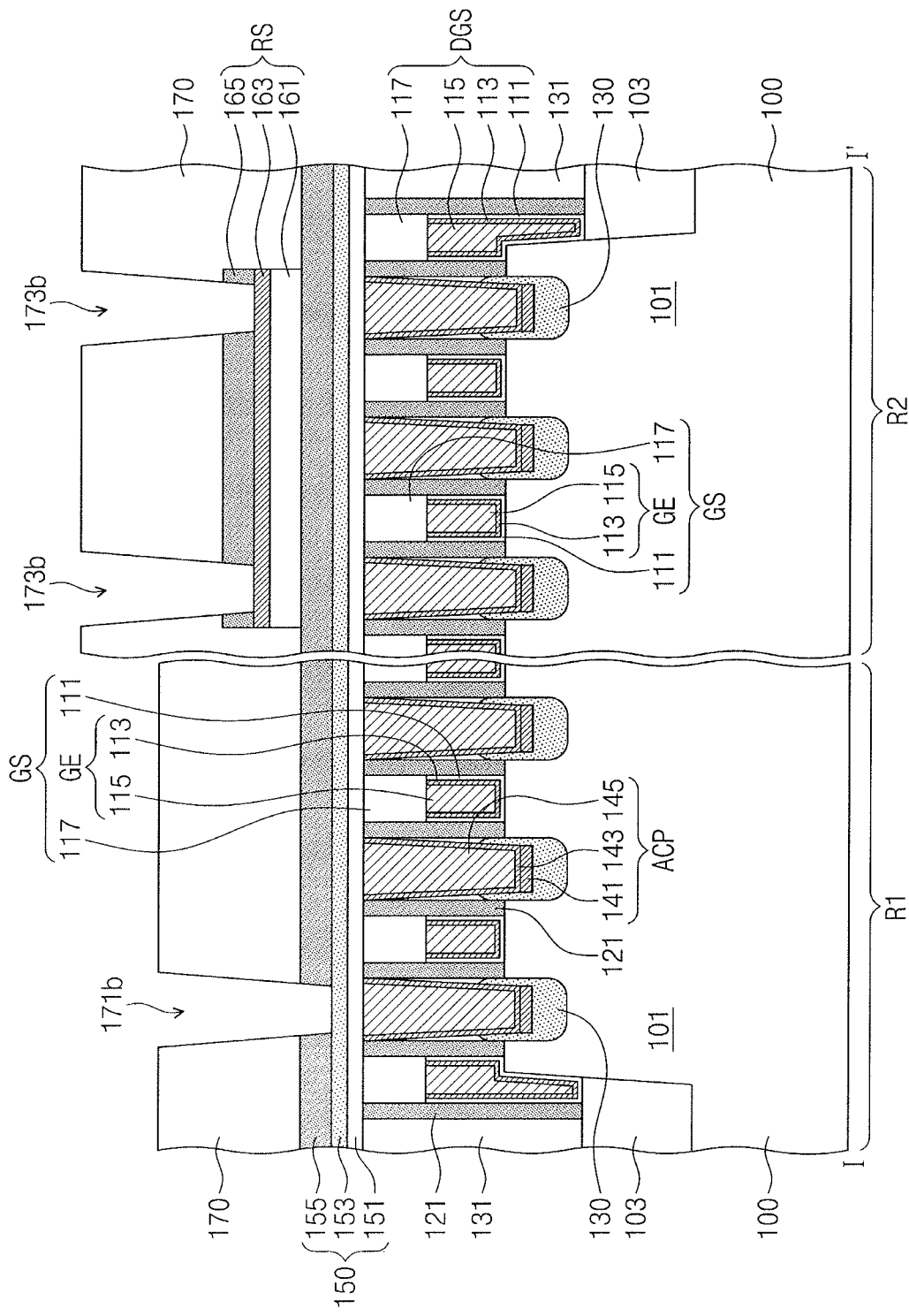

Referring to FIG. 13, after the mask pattern MP is removed, a second etching process may be performed on the third insulation layer 155 and the hardmask pattern 165 respectively exposed through the first and second openings 171a and 173a. The second etching process may be performed by using an etch recipe having an etch selectivity with respect to the second insulation layer 153 and the resistance conductive pattern 163, forming an expanded first opening 171b to expose the second insulation layer 153 on the first region R1. The second etching process may also form expanded second openings 173b to expose the resistance conductive pattern 163 on the second region R2.

Figure 14:
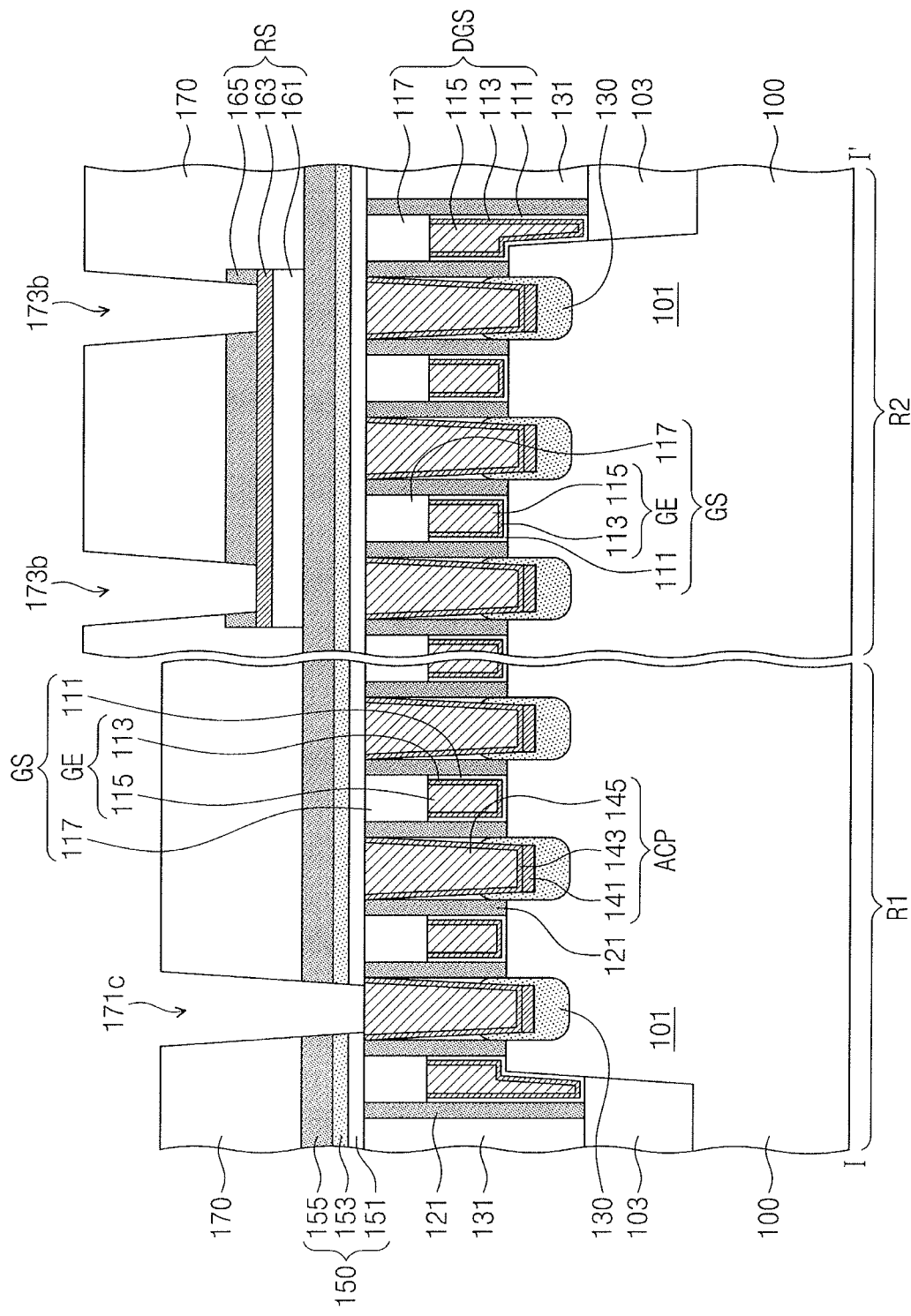

Referring to FIG. 14, a third etching process may be performed to sequentially etch the second insulation layer 153 exposed through the first opening 171b and the first insulation layer 151 below the first opening 171b. A stripping process or a wet etching process may be performed as the third etching process. The third etching process may be performed using an etch recipe or etchant having an etch selectivity with respect to the active contact patterns ACP and the resistance conductive pattern 163. The third etching process may form a further expanded first opening 171c to expose the active contact pattern ACP.

A metal barrier layer and a metal layer may be sequentially formed in the first and second openings 171c and 173b, and a planarization process may be performed on the metal barrier layer and the metal layer to form first and second contact plugs CP1 and CP2 each of which includes a second barrier metal layer 181 and a second metal layer 183, as illustrated in FIG. 2. The planarization process may cause the first and second contact plugs CP1 and CP2 to have their top surfaces substantially coplanar with each other.

Figure 15:
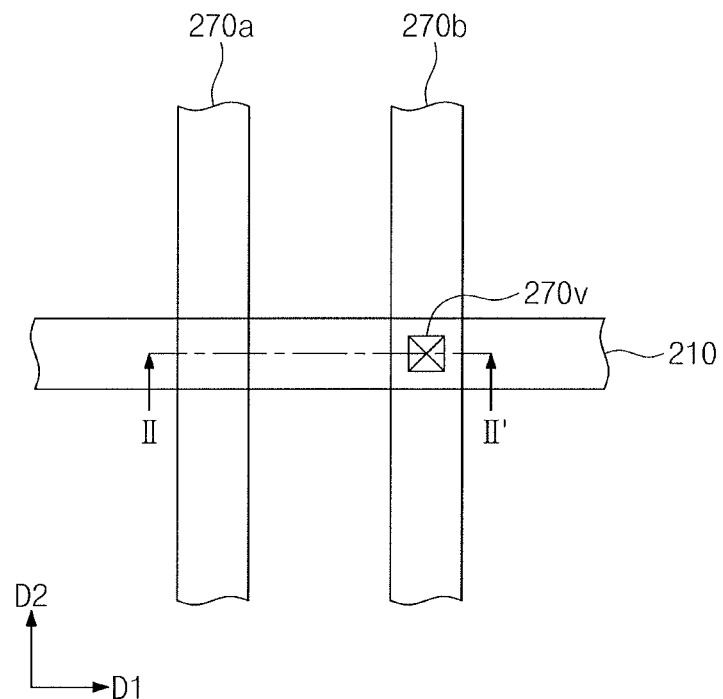
FIG. 15 illustrates a simplified plan view showing a semiconductor device according to exemplary embodiments.
Figure 16:
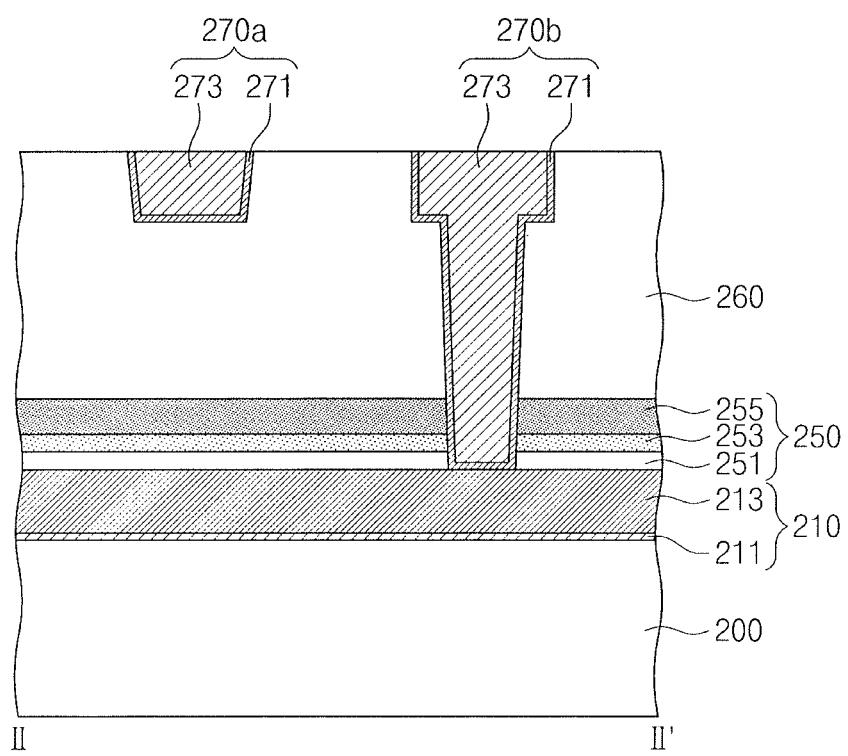
FIG. 16 illustrates a cross-sectional view taken along line II-IF of FIG. 14, showing a semiconductor device according to exemplary embodiments.

FIG. 15 illustrates a simplified plan view of a semiconductor device according to exemplary embodiments. FIG. 16 illustrates a cross-sectional view taken along line II-II' of FIG. 14, showing a semiconductor device according to exemplary embodiments. The same technical features as those of the embodiments discussed above may be omitted in the interest of brevity of description.

Referring to FIGS. 15 and 16, a lower insulation layer 200 may be provided thereon with a lower line 210 extending in a first direction D1. The lower line 210 may be formed of a metallic material, and may include a lower metal barrier layer 211 and a lower metal layer 213.

An etch stop layer 250 may cover a top surface of the lower line 210, and an upper insulation layer 260 may be disposed on the etch stop layer 250. As discussed above, the etch stop layer 250 may include first, second, and third insulation layers 251, 253, and 255.

Upper lines 270a and 270b may be disposed in the upper insulation layer 260. The upper lines 270a and 270b may extend in a second direction D2 intersecting the first direction D1. At least one 270b of the upper lines 270a and 270b may include a via segment 270v penetrating the upper insulation layer 260 and connected to the lower line 210 and a wiring segment extending in the second direction D2, which wiring segment is connected to the via segment 270v.

Each of the upper lines 270a and 270b may be disposed in a via hole and a trench that are formed by patterning the upper insulation layer 260 on which a mask pattern is formed. Each of the upper lines 270a and 270b may be formed of a metallic material, and may include an upper metal barrier layer 271 and an upper metal layer 273. In an implementation, when the upper insulation layer 260 is patterned to form the via hole exposing the lower line 210, an etching process may be performed on the upper insulation layer 260 and the etch stop layer 250, as discussed above with reference to FIGS. 12 to 14.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, as a semiconductor device becomes highly integrated, MOSFET's may be scaled-down in size, which may result in deterioration of operating characteristics of the semiconductor device. For example, high speed operation may be difficult to achieve because a reduction in critical dimension (CD) could increase resistance of metal lines and capacitance between metal lines. Semiconductor devices having high performance while overcoming limitations due to high integration of the semiconductor devices may be considered.

According to exemplary embodiments, contact holes may be formed using an etch stop layer having a multi-layered structure including first to third insulation layers, and thus metal-containing conductive patterns may be prevented from being damaged when the contact holes are formed.

For example, silicon nitride may be thickly deposited to form the third insulation layer (that is the topmost one of the first to third insulation layers constituting the etch stop layer), and therefore cobalt-containing conductive patterns may be prevented from being exposed to an etching process in which oxygen and/or fluorine are used. As a result, it may be possible to reduce or prevent damage to the conductive patterns and to reduce or prevent an increase in resistance of the conductive patterns.

The embodiments may provide a semiconductor device including a field effect transistor.

The embodiments may provide a semiconductor device having high integration and improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a plurality of gate structures on a semiconductor substrate,
   a plurality of source/drain impurity layers in the semiconductor substrate on opposite sides of each gate structure of the plurality of gate structures;
   a plurality of metal contact patterns connected to the plurality of gate structures and the plurality of source/drain impurity layers;
   an etch stop layer covering top surfaces of the plurality of metal contact patterns and top surfaces of the plurality of gate structures;
   an interlayer dielectric layer on the etch stop layer; and
   a contact plug penetrating the interlayer dielectric layer and the etch stop layer and connected to one metal contact pattern of the plurality of metal contact patterns,
   wherein:
   the etch stop layer includes a sequentially stacked first insulation layer, second insulation layer, and third insulation layer,
   the first insulation layer, second insulation layer, and third insulation layer include different insulating materials from each other,
   the first insulation layer directly contacts top surfaces of the plurality of metal contact patterns and top surfaces of the plurality of gate structures,
   a thickness of the third insulation layer is greater than a thickness of the second insulation layer and a thickness of the first insulation layer,
   the semiconductor substrate includes a first region and a second region,
   the third insulation layer includes a first portion on the first region and a second portion on the second region,
   the first portion has a first thickness and the second portion has a second thickness greater than the first thickness, and
   the first thickness is greater than a thickness of the second insulation layer.

2. The device as claimed in claim 1, wherein:
   the first insulation layer includes a first insulating material that contains a metallic element and nitrogen,
   the second insulation layer includes a second insulating material that contains carbon, and
   the third insulation layer includes a third insulating material that does not contain a metallic element and carbon.

3. The device as claimed in claim 1, wherein the thickness of the third insulation layer is greater than a sum of thicknesses of the first insulation layer and the second insulation layer.

4. The device as claimed in claim 1, wherein:
   each gate structure of the plurality of gate structures includes a gate dielectric layer, a metal gate electrode, and a capping insulation pattern that are sequentially stacked on the semiconductor substrate, and
   the etch stop layer is in contact with the capping insulation pattern.

5. The device as claimed in claim 1, wherein the plurality of metal contact patterns include cobalt (Co), titanium (Ti), tantalum (Ta), ruthenium (Ru), tungsten (W), or cobalt tungsten phosphorous (CoWP).

6. The device as claimed in claim 1, wherein the second insulation layer includes SiOC, SiCN, or SiOCN.

7. A semiconductor device, comprising:
   a semiconductor substrate including a first region and a second region;
   a plurality of gate structures on the first region and the second region of the semiconductor substrate;
   a plurality of metal contact patterns in a gap-fill insulation layer covering the plurality of gate structures, the plurality of metal contact patterns connected to the plurality of gate structures and a plurality of source/drain impurity layers;
   an etch stop layer covering top surfaces of the plurality of metal contact patterns and including a sequentially stacked first insulation layer, second insulation layer, and third insulation layer;
   a resistance structure on the etch stop layer on the second region;

an interlayer dielectric layer covering the resistance structure and the etch stop layer;
a buffer insulation layer between the resistance structure and the etch stop layer on the second region;
a first contact plug penetrating the interlayer dielectric layer and the etch stop layer and connected to at least one metal contact pattern of the plurality of metal contact patterns on the first region; and
a second contact plug penetrating the interlayer dielectric layer and connected to the resistance structure on the second region,
wherein:
the first insulation layer, second insulation layer, and third insulation layer include different insulating materials from each other,
the buffer insulation layer is spaced apart from the first contact plug,
the first insulation layer directly contacts top surfaces of the plurality or metal contact patterns and top surfaces of the plurality of gate structures, and a thickness of the third insulation layer is greater than a thickness of the second insulation layer and a thickness of the first insulation layer.

8. The device as claimed in claim 7, wherein the thickness of the third insulation layer is greater than a sum of thicknesses of the first insulation layer and the second insulation layer.

9. The device as claimed in claim 7, wherein the buffer insulation layer includes an insulating material that is different from that of the interlayer dielectric layer and that of the third insulation layer.

10. The device as claimed in claim 7, wherein:
the first insulation layer includes a first insulating, material that contains a metallic element and nitrogen,
the second insulation layer includes a second insulating material that contains carbon, and
the third insulation layer includes a third insulating material that does not contain a metallic element and carbon.

* * * * *